United States Patent
Lee et al.

(10) Patent No.: US 7,683,684 B2
(45) Date of Patent: Mar. 23, 2010

(54) POWER-DOWN MODE CONTROL APPARATUS AND DLL CIRCUIT HAVING THE SAME

(75) Inventors: Hyun-Woo Lee, Ichon (KR); Won-Joo Yun, Ichon (KR); Dong-Suk Shin, Ichon (KR)

(73) Assignee: Hynix Semiconductor, Inc. (KR)

( * ) Notice: Subject to any disclaimer, the term of this patent is extended or adjusted under 35 U.S.C. 154(b) by 0 days.

(21) Appl. No.: 12/175,212

(22) Filed: Jul. 17, 2008

(65) Prior Publication Data

US 2009/0121784 A1    May 14, 2009

(30) Foreign Application Priority Data

Nov. 9, 2007    (KR) .................. 10-2007-0114147

(51) Int. Cl.
*H03L 7/06*    (2006.01)
(52) U.S. Cl. .................. 327/158; 327/159; 327/149
(58) Field of Classification Search .............. 327/158, 327/149, 148, 150, 159
See application file for complete search history.

(56) References Cited

U.S. PATENT DOCUMENTS

| 7,348,819 B2 | 3/2008 | Choi | |
| 7,388,415 B2 * | 6/2008 | Lee | 327/158 |
| 2007/0069776 A1 * | 3/2007 | Hur | 327/158 |
| 2007/0188206 A1 * | 8/2007 | Lee | 327/158 |
| 2008/0002516 A1 | 1/2008 | Tsera et al. | |
| 2008/0239846 A1 * | 10/2008 | Ku | 365/194 |

FOREIGN PATENT DOCUMENTS

| JP | 2007-221750 | 8/2007 |
| KR | 1020040007203 A | 1/2004 |
| KR | 1020050003528 A | 1/2005 |

* cited by examiner

*Primary Examiner*—Lincoln Donovan
*Assistant Examiner*—Adam D Houston
(74) *Attorney, Agent, or Firm*—Baker & McKenzie LLP

(57) ABSTRACT

A power-down mode control apparatus includes an internal power-down control block configured to receive a locking completion signal and to generate an internal power-down signal, which is toggled for a predetermined time; a noise check block configured to check occurrence/non-occurrence of noise on the basis of a phase detection signal and to generate a plurality of power-down selection signals in response to the locking completion signal and the internal power-down signal; and a power-down enter control block configured to generate a plurality of power-down enter signals, which instruct individual circuits to enter a power-down mode in response to a reference clock signal, the plurality of power-down selection signals, a power-down mode signal, and the internal power-down signal.

12 Claims, 5 Drawing Sheets

POWER-DOWN MODE CONTROL APPARATUS AND DLL CIRCUIT HAVING THE SAME

CROSS-REFERENCES TO RELATED PATENT APPLICATION

This application claims the benefit under 35 U.S.C 119(a) to Korean Application No. 10-2007-0114147, filed on Nov. 9, 2007, in the Korean Intellectual Property Office, the disclosure of which is incorporated herein by reference in its entirety as if set forth in full.

BACKGROUND

1. Technical Field

The embodiments described herein relate to a semiconductor integrated circuit, and more particularly, to a power-down mode control apparatus for a semiconductor integrated circuit and a DLL (Delay Locked Loop) circuit having the same.

2. Related Art

A conventional DLL circuit supplies an internal clock signal having a more advanced phase than a reference clock signal, which is obtained by converting an external clock signal, for a predetermined time. The internal clock signal that is used in a semiconductor integrated circuit is delayed by a clock signal buffer and a transmission line. Then, a phase difference is generated between the internal clock signal and the external clock signal, causing an output data access time be longer. The DLL circuit is used to solve this problem. In order to increase an effective data output period, the DLL circuit controls the internal clock signal to have a more advanced phase than the external clock signal for a predetermined time.

A recent semiconductor integrated circuit has a power-down mode function for low power consumption. That is, during a period in which the semiconductor integrated circuit does not need to be operated, a power-down mode is activated to cut power supply to internal circuits, thereby reducing power consumption. A DLL circuit which is used in the semiconductor integrated circuit also has a power-down mode function. In this case, when an externally input power-down mode signal is enabled, predetermined constituent elements stop operations.

If the operations of a plurality of constituent elements are stopped simultaneously in response to the power-down mode signal, noise may occur due to a rapid state change in each constituent element. Resultant noise may be accompanied by a jitter component in the locked output clock signal of the DLL circuit, and as a result, an unstable clock signal may be generated. In addition, when the power-down mode is terminated, a delay value which is set before the power-down mode is activated may be changed. Accordingly, the phase of the clock signal may be distorted. As such, if the DLL circuit is erroneously operated, a circuit, such as a data input/output buffer, to which the clock signal is supplied from the DLL circuit, may not normally operate.

The conventional DLL circuit has only a function to simultaneously stop a plurality of constituent elements when the power-down mode is activated, but it still cannot suppress the erroneous operation. Accordingly, during the power-down mode, the DLL circuit is affected by noise. In addition, it is not possible to sufficiently support a semiconductor integrated circuit that can achieve low power consumption during a power-down mode.

SUMMARY

A power-down mode control apparatus that can suppress the occurrence of noise during a power-down mode, thereby implementing a stable power-down mode, and a DLL circuit having the same are described herein.

According to one aspect, a power-down mode control apparatus can include an internal power-down control block that can be configured to receive a locking completion signal and to generate an internal power-down signal, which is toggled for a predetermined time, a noise check block that can be configured to check occurrence/non-occurrence of noise on the basis of a phase detection signal and to generate a plurality of power-down selection signals in response to the locking completion signal and the internal power-down signal, and a power-down enter control block that can be configured to generate a plurality of power-down enter signals, which instruct individual circuits to enter a power-down mode, in response to a reference clock signal, the plurality of power-down selection signals, a power-down mode signal, and the internal power-down signal.

According to another aspect a DLL circuit can include a feedback loop which can be configured to delay a reference clock signal to generate a delayed clock signal, a feedback clock signal, and a locking completion signal, and in response to first and second power-down enter signals, to determine entrance of individual constituent elements into a power-down mode, a first phase detection apparatus that can be configured to determine whether or not a phase difference between the reference clock signal and the feedback clock signal exceeds a predetermined range, thereby generating a first phase detection signal, and a power-down mode control apparatus that can be configured to determine whether or not to enable the first and/or second power-down enter signals in response to the reference clock signal, the first phase detection signal, the locking completion signal, and a power-down mode signal.

According to yet another aspect, a DLL circuit can include a feedback loop which can be configured to delay a reference clock signal in response to a plurality of sample clock signals to generate a delayed clock signal, a feedback clock signal, and a locking completion signal, a first phase detection apparatus that can be configured to determine whether or not a phase difference between the reference clock signal and the feedback clock signal exceeds a predetermined range, thereby generating a first phase detection signal, a power-down mode control apparatus that can be configured to determine whether or not to enable first and/or second power-down enter signals in response to the reference clock signal, the first phase detection signal, the locking completion signal, and a power-down mode signal; a clock signal driver which can be configured to drive the reference clock signal to generate a driving clock signal, when the first power-down enter signal is disabled, and a clock signal generator configured to generate the plurality of sample clock signals in response to the driving clock signal, when the second power-down enter signal is disabled.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
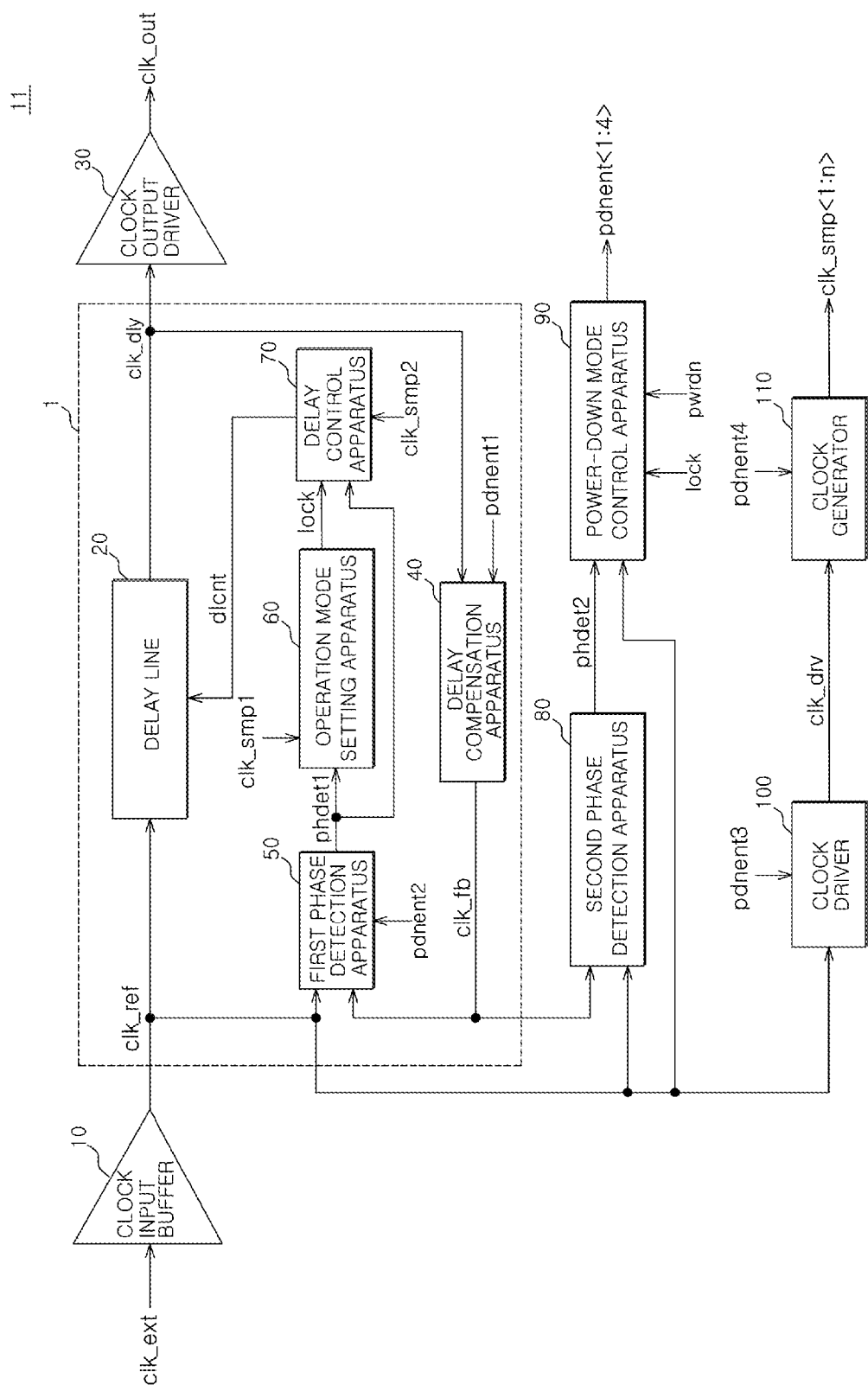
FIG. 1 is a block diagram illustrating a configuration of a DLL circuit according to an embodiment described herein.

FIG. 1 is a block diagram illustrating a configuration of a DLL circuit 11 according to an embodiment described herein. Referring to FIG. 1, the DLL circuit 11 can include a clock signal input buffer 10, a delay line 20, a clock signal output driver 30, a delay compensation apparatus 40, a first phase detection apparatus 50, an operation mode setting apparatus 60, a delay control apparatus 70, a second phase detection apparatus 80, a power-down mode control apparatus 90, a clock signal driver 100, and a clock signal generator 110.

The clock signal input buffer 10 can buffer an external clock signal "clk_ext", thereby generating a reference clock signal "clk_ref". The delay line 20 delays the reference clock signal "clk_ref" in response to a delay control signal "dlcnt" to generate a delayed clock signal "clk_dly". The clock signal output driver 30 can drive the delayed clock signal "clk_dly" to generate an output clock signal "clk_out".

The delay compensation apparatus 40 can delay the delayed clock signal "clk_dly" for a predetermined time to generate a feedback clock signal "clk_fb" when a first power-down enter signal "pdnent1" is disabled. The delay compensation apparatus 40 can be configured such that power supply is cut when the first power-down enter signal "pdnent1" is enabled. This configuration may be easily made by those skilled in the art. Meanwhile, a delay time, for which the delay compensation apparatus 40 can delay the delayed clock signal "clk_dly", can be obtained by modeling delay values of delay elements on an output path of the delayed clock signal "clk_dly" to the data input/output buffer.

When a second power-down enter signal "pdnent2" is disabled, the first phase detection apparatus 50 can compare the phase of the reference clock signal "clk_ref" with the phase of the feedback clock signal "_fb", thereby generating a first phase detection signal "phdet1". When the second power-down enter signal "pdnent2" is disabled, the first phase detection signal "phdet1" can include information regarding which of the reference clock signal "clk_ref" and the feedback clock signal "clk_fb" has an earlier rising edge. The first phase detection apparatus 50 can also be configured such that power supply is cut when the second power-down enter signal "pdnent2" is enabled.

The operation mode setting apparatus 60 can generate a locking completion signal lock in response to a first sample clock signal "clk_smpz1" and the first phase detection signal "phdet1". The locking completion signal "lock" can inform the delay control apparatus 70 and the clock signal driver 100 that a coarse delay mode of the DLL circuit has been completed and a fine delay mode has been executed. The delay control apparatus 70 can generate the delay control signal "dlcnt" in response to a second sample clock signal "clk_smp2", the first phase detection signal "phdet1", and the locking completion signal "lock". The delay control signal "dlcnt" can control a coarse delay time and a fine delay time to be given to the reference clock signal "clk_ref" by the delay line 20.

Here, the delay line 20, the delay compensation apparatus 40, the first phase detection apparatus 50, the operation mode setting apparatus 60, and the delay control apparatus 70 can comprise a feedback loop 1.

The second phase detection apparatus 80 can determine whether or not a phase difference between the reference clock signal "clk_ref" and the feedback clock signal "clk_fb" exceeds a predetermined range, thereby generating a second phase detection signal "phdet2". The second phase detection signal "phdet2" can be enabled when the phase difference between the reference clock signal "clk_ref" and the feedback clock signal "clk_fb" exceeds the predetermined range. That is, the second phase detection signal "phdet2" can inform that noise occurs in the DLL circuit.

The power-down mode control apparatus 90 can determine whether or not to enable the first power-down enter signal "pdnent1", the second power-down enter signal "pdnent2", a third power-down enter signal "pdnent3", and a fourth power-down enter signal "pdnent4" in response to the reference clock signal "clk_ref", the second phase detection signal phdet2, the locking completion signal lock, and a power-down mode signal "pwrdn".

The power-down mode control apparatus 90 can enable the first to fourth power-down enter signals "pdnent1" to "pdnent4" in a state where the locking completion signal lock is enabled and the power-down mode signal "pwrdn" is disabled. Then, the power-down mode control apparatus 90 can check occurrence/non-occurrence of noise in the reference clock signal "clk_ref" and the feedback clock signal "clk_fb" when the delay compensation apparatus 40, the first phase detection apparatus 50, the clock signal driver 100, and the clock signal generator 110, to which the first to fourth power-down enter signals "pdnent1" to "pdnent4" are correspondingly input, stop operations.

Thereafter, if it is detected that the occurrence amount of noise exceeds a critical value, the power-down mode control apparatus 90 can controls the enable timing of the first to fourth power-down enter signals "pdnent1" to "pdnent4", and can find a power-down method for minimizing occurrence of noise while stopping the four constituent elements, that is, the delay compensation apparatus 40, the first phase detection apparatus 50, the clock signal driver 100, and the clock signal generator 110, by threes, twos, or ones. According to the power-down method set in this manner, if the power-down mode signal "pwrdn", which is externally input and instructs to enter a power-down mode, is enabled, the first to fourth power-down can enter signals "pdnent1" to "pdnent4" simultaneously or sequentially in correspondence with the occurrence amount of noise.

The clock signal driver 100 can drive the reference clock signal "clk_ref" to generate a driving clock signal "clk_drv" when the third power-down enter signal "pdnent3" is disabled. The clock signal generator 110 can generate n sample clock signals "_smp<1:n>" (where n is a natural number of 2 or more) in response to the driving clock signal "clk_drv" when the fourth power-down enter signal "pdnent4" is disabled. Each of the n sample clock signals "_smp<1:n>" can be in a shape of a pulse which has an enable period corresponding to one cycle of the reference clock signal "clk_ref" and can be enabled for every predetermined number of cycles (for example, 20 cycles) of the reference clock signal "clk_ref". The first sample clock signal "clk_smp1" and the second sample clock signal "_smp2" refer to two sample clock signals selected from among the n sample clock signals "_smp<1:n>".

As described above, the DLL circuit 11 can include the power-down mode control apparatus 90, having an advantage of minimizing occurrence of noise during the power-down mode. That is, the power-down mode control apparatus 90 can check the occurrence amount of noise and controls how many constituent elements are to stop operations at one time. Accordingly, when the power-down mode is activated, the operation stability of the DLL circuit 11 can be improved.

Here, the delay compensation apparatus 40, the first phase detection apparatus 50, the clock signal driver 100, and the clock signal generator 110 can be configured such that power supply is cut during the power-down mode, but other constituent elements may be configured such that power supply is cut during the power-down mode. It should be noted that this also falls within the scope of the embodiments.

Figure 2:
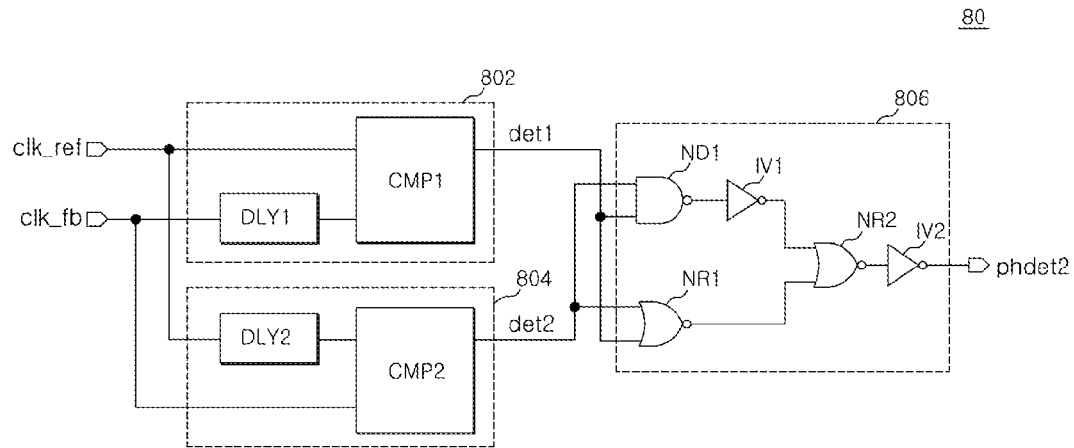
FIG. 2 is a diagram illustrating a detailed configuration of a second phase detection apparatus that can be included in the circuit illustrated in FIG. 1.

Referring to FIG. 2, the second phase detection apparatus 80 can include a first detection block 802, a second detection block 804, and a signal combination block 806.

The first detection block 802 can detect whether or not the phase of the feedback clock signal "clk_fb" is more advanced than the phase of the reference clock signal "clk_ref" for a first time, thereby generating a first detection signal "det1". The first detection block 802 can include a first delay unit DLY1 and a first phase comparator CMP1.

The first delay unit DLY1 can delay the feedback clock signal "clk_fb" for the first time. The first phase comparator CMP1 can compare the phase of the reference clock signal "clk_ref" with the phase of an output clock signal of the first delay unit DLY1, thereby generating the first detection signal "det1".

The second detection block 804 can detect whether or not the phase of the reference clock signal "clk_ref" is more advanced than the phase of the feedback clock signal "clk_fb" for a second time, thereby generating a second detection signal "det2". The second detection block 804 can include a second delay unit DLY2 and a second phase comparator CMP2.

The second delay unit DLY2 can delay the reference clock signal "clk_ref" for the second time. The second phase comparator CMP2 can compare the phase of the feedback clock signal "clk_fb" with the phase of an output clock signal of the second delay unit DLY2, thereby generating the second detection signal "det2".

The signal combination block 806 can combine the first detection signal "det1" and the second detection signal "det2" to generate the second phase detection signal "phdet2". The signal combination block 806 can include a first NAND gate ND1, a first inverter IV1, a second inverter IV2, a first NOR gate NR1, and a second NOR gate NR2.

The first NAND gate ND1 can receive the first detection signal "det1" and the second detection signal "det2". The first inverter IV1 can receive an output signal of the first NAND gate ND1. The first NOR gate NR1 can receive the first detection signal "det1" and the second detection signal "det2". The second NOR gate NR2 can receive an output signal of the first inverter IV1 and an output signal of the first NOR gate NR1. The second inverter IV2 can receive an output signal of the second NOR gate NR2 and output the second phase detection signal "phdet2".

The first time and the second time refer to time which can indicate the critical value of occurrence of noise which is defined according to design. That is, the second phase detection signal "phdet2" can be enabled when the first detection signal "det1" and the second detection signal "det2" are both at high level or low level. In a case in which the DLL circuit completes a delay locking operation and the locking completion signal lock can be enabled, the rising edge of the reference clock signal "clk_ref" can be substantially identical to the rising edge of the feedback clock signal "clk_fb". Accordingly, the first detection signal "det1" can become the high level and the second detection signal "det2" can become the low level. Then, the second phase detection signal "phdet2" should be disabled. However, if the phase of the reference clock signal "clk_ref" or the phase of the feedback clock signal "clk_fb" is distorted due to occurrence of noise, the first detection signal "det1" and the second detection signal "det2" may be both at high level or low level. In this case, the second phase detection apparatus 80 can recognize that noise occurs, and thus can enable the second phase detection signal "phdet2".

Figure 3:
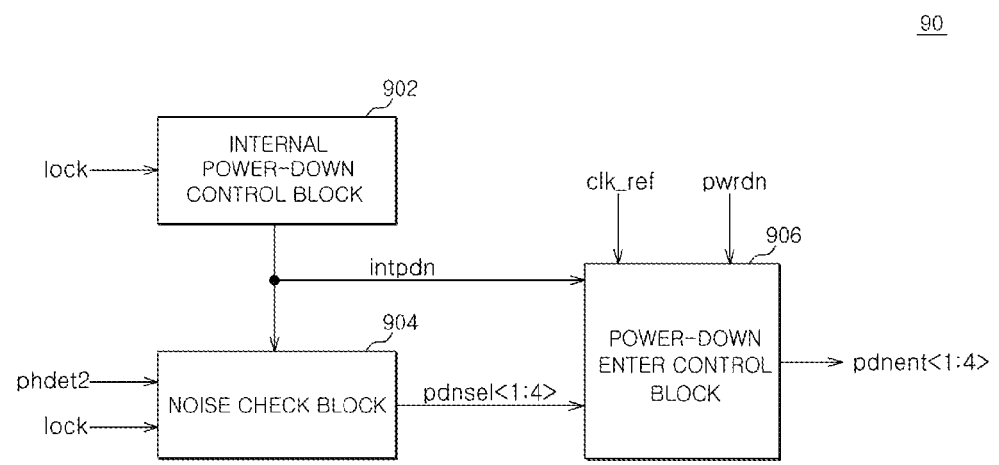
FIG. 3 is a block diagram illustrating a configuration of a power-down mode control apparatus that can be included in the circuit illustrated in FIG. 1.

FIG. 3 is a block diagram illustrating a configuration of a power-down mode control apparatus 90 that can be included in the circuit illustrated in FIG. 1. Referring to FIG. 3, the power-down mode control apparatus 90 can include an internal power-down control block 902, a noise check block 904, and a power-down enter control block 906.

The internal power-down control block 902 can receive the locking completion signal "lock" and can generate an internal power-down signal "intpdn", which can be toggled for a predetermined time. The noise check block 904 can check the occurrence/non-occurrence of noise on the basis of the second phase detection signal "phdet2" and, in response to the locking completion signal "lock" and the internal power-down signal "intpdn", can generate first to fourth power-down selection signals "pdnsel1" to "pdnsel4". The power-down enter control block 906 can generate, in response to the reference clock signal "clk_ref", the first to fourth power-down selection signals "pdnsel1" to "pdnsel4", the power-down mode signal "pwrdn", and the internal power-down signal "intpdn", and the first to fourth power-down enter signals "pdnent1" to "pdnent4", which can be enabled simultaneously or sequentially.

In the power-down mode control apparatus 90 having the above-described structure, if the locking completion signal lock is enabled, the internal power-down control block 902 can toggle the internal power-down signal "intpdn" for a predetermined time. Then, the noise check block 904 can generate the first to fourth power-down selection signals "pdnsel1" to "pdnsel4" in response to the internal power-down signal "intpdn" when the second phase detection signal "phdet2" is enabled. The logical values of the first to fourth power-down selection signals "pdnsel1" to "pdnsel4" can initially be (1, 0, 0, 0). Subsequently, the logical values of the second to fourth power-down selection signals "pdnsel2" to "pdnsel4" can be sequentially changed from "0" to "1" each time it is detected that the second phase detection signal "phdet2" is enabled. That is, the noise check block 904 can sequentially change the logical values of the second to fourth power-down selection signals "pdnsel2" to ""pdnsel4"" from "0" to "1" until the occurrence amount of noise when the DLL circuit enters the power-down mode is reduced below the critical value.

If the internal power-down signal "intpdn" can become the high level, or if the power-down mode signal "pwrdn" is enabled, the power-down enter control block 906 can generate the first to fourth power-down enter signals "pdnent1" to "pdnent4" in response to the reference clock signal "clk_ref" and the first to fourth power-down selection signals "pdnsel1" to "pdnsel4". At the beginning of the operation of the power-down enter control block 906, if the logical values of the first to fourth power-down selection signals "pdnsel1" to "pdnsel4" are (1, 0, 0, 0), the first to fourth power-down enter signals "pdnent1" to "pdnent4" are simultaneously enabled or disabled.

Meanwhile, if the logical values of the first to fourth power-down selection signals "pdnsel1" to "pdnsel4" are (1, 1, 0, 0), the second to fourth power-down enter signals "pdnent2" to "pdnent4" can be simultaneously enabled or disabled when a predetermined time elapses after the first power-down enter signal "pdnent1" is enabled or disabled. In addition, if the logical values of the first to fourth power-down selection signals "pdnsel1" to "pdnsel4" are (1, 1, 1, 0), the first power-down enter signal "pdnent1" is enabled or disabled, then the second power-down enter signal "pdnent2" is enabled or disabled, and subsequently after a predetermined time elapses, the third and fourth power-down enter signals "pdnent3" and "pdnent4" can be enabled or disabled. Furthermore, if the logical values of the first to fourth power-down selection signals "pdnsel1" to "pdnsel4" are (1, 1, 1, 1), the first to fourth power-down enter signals "pdnent1" to "pdnent4" can be sequentially enabled or disabled one by one.

As such, the power-down mode control apparatus 90 can detect the occurrence/non-occurrence of noise more than a critical value on the basis of the second phase detection signal "phdet2" when the power-down mode is activated, and can generate the internal power-down signal "intpdn" to fix the logical value of the first to fourth power-down selection signals "pdnsel1" to "pdnsel4". Here, the logical values of the first to fourth power-down selection signals "pdnsel1" to "pdnsel4" can be fixed so as to minimize noise. The first to fourth power-down enter signals "pdnent1" to "pdnent4" can be enabled simultaneously or sequentially in response to the first to fourth power-down selection signals "pdnsel1" to "pdnsel4". Accordingly, the individual constituent elements of the DLL circuit, to which the first to fourth power-down enter signals "pdnent1" to "pdnent4" are supplied, can enter the power-down mode simultaneously or sequentially according to the occurrence amount of noise. Therefore, the operation stability of the DLL circuit can be improved.

Figure 4:
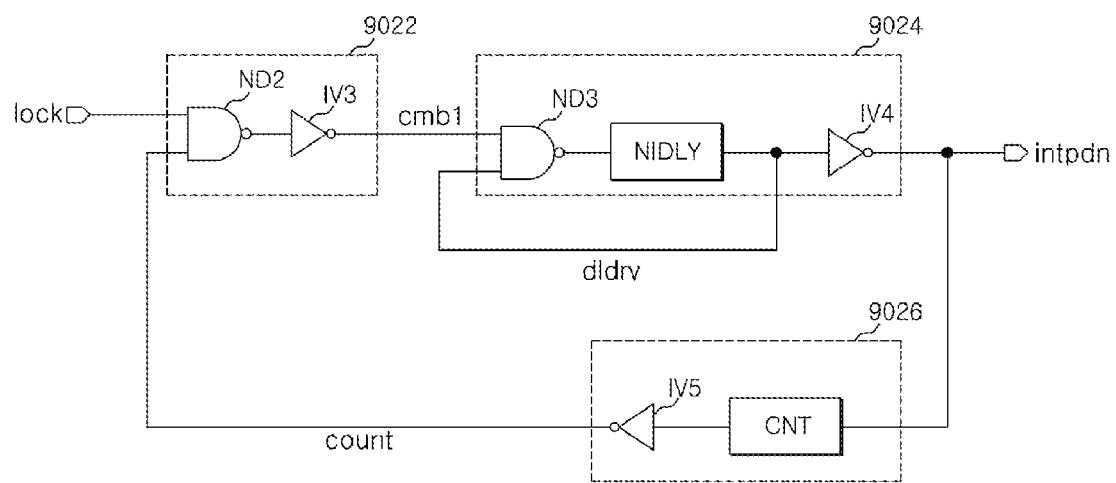
FIG. 4 is a diagram illustrating a detailed configuration of an internal power-down control block that can be included in the circuit illustrated in FIG. 3.

FIG. 4 is a diagram illustrating a detailed configuration of an internal power-down control block 902 that can be included in the circuit illustrated in FIG. 3. Referring to FIG. 4, the internal power-down control block 902 can include a first signal combination unit 9022, an oscillation unit 9024, and a count unit 9026.

The first signal combination unit 9022 can combine the locking completion signal "lock" and a count signal "count" to generate a first combination signal "cmb1". The first signal combination unit 9022 can include a second NAND gate ND2 and a third inverter IV3.

The second NAND gate ND2 can receive the locking completion signal "lock" and the count signal "count". The third inverter IV3 can receive an output signal of the second NAND gate ND2 and can output the first combination signal "cmb1".

The oscillation unit 9024 can receive the first combination signal "cmb1" and a feedback delay driving signal "dldrv", and can generate the delay driving signal "dldrv" and the internal power-down signal "intpdn". The oscillation unit 9024 can include a third NAND gate ND3, a non-inverting delay element NIDLY and a fourth inverter IV4.

The third NAND gate ND3 can receive the first combination signal "cmb1" and the feedback delay driving signal "dldrv". The non-inverting delay element NIDLY can delay an output signal of the third NAND gate ND3 in a non-inverting manner and can output the delay driving signal "dldrv". The fourth inverter IV4 can receive the delay driving signal "dldrv" and can output the internal power-down signal "intpdn".

The count unit 9026 can generate the count signal count in response to the internal power-down signal "intpdn". The count unit 9026 can include a counter CNT and a fifth inverter IV5. The counter CNT can perform a count operation in response to the internal power-down signal "intpdn". The fifth inverter IV5 can receive an output signal of the counter CNT and can output the count signal "count".

At the beginning of the operation of the internal power-down control block 902, the count signal "count" can be at a high level. In this case, if the locking completion signal lock is kept disabled, the first combination signal "cmb1" can become a low level. The delay driving signal "dldrv" can be at a high level, and the internal power-down signal "intpdn" can be at a low level.

Subsequently, if the locking completion signal "lock" is enabled, the first combination signal "cmb1" can be enabled at a high level, and the delay driving signal "dldrv" can be toggled. Similarly, the internal power-down signal "intpdn" can be toggled in a phase opposite to that of the delay driving signal "dldrv", and the counter CNT of the count unit 9026 can start to operate. The counter CNT can be configured to output a signal at a high level when the count operation is completed. Accordingly, if the count operation of the counter CNT is completed, the count signal "count" can become a low level, the first combination signal "cmb1" can be disabled, and toggling of the delay driving signal "dldrv" and toggling of the internal power-down signal "intpdn" can be stopped.

That is, the internal power-down control block 902 can be configured to toggle the internal power-down signal "intpdn" during a period in which the counter CNT operates. By controlling a count period of the counter CNT, the toggle period of the internal power-down signal "intpdn" can be defined so as to appropriately fix the logical values of the first to fourth power-down selection signals "pdnsel1" to "pdnsel4" before the power-down mode signal "pwrdn" is enabled.

Figure 5:
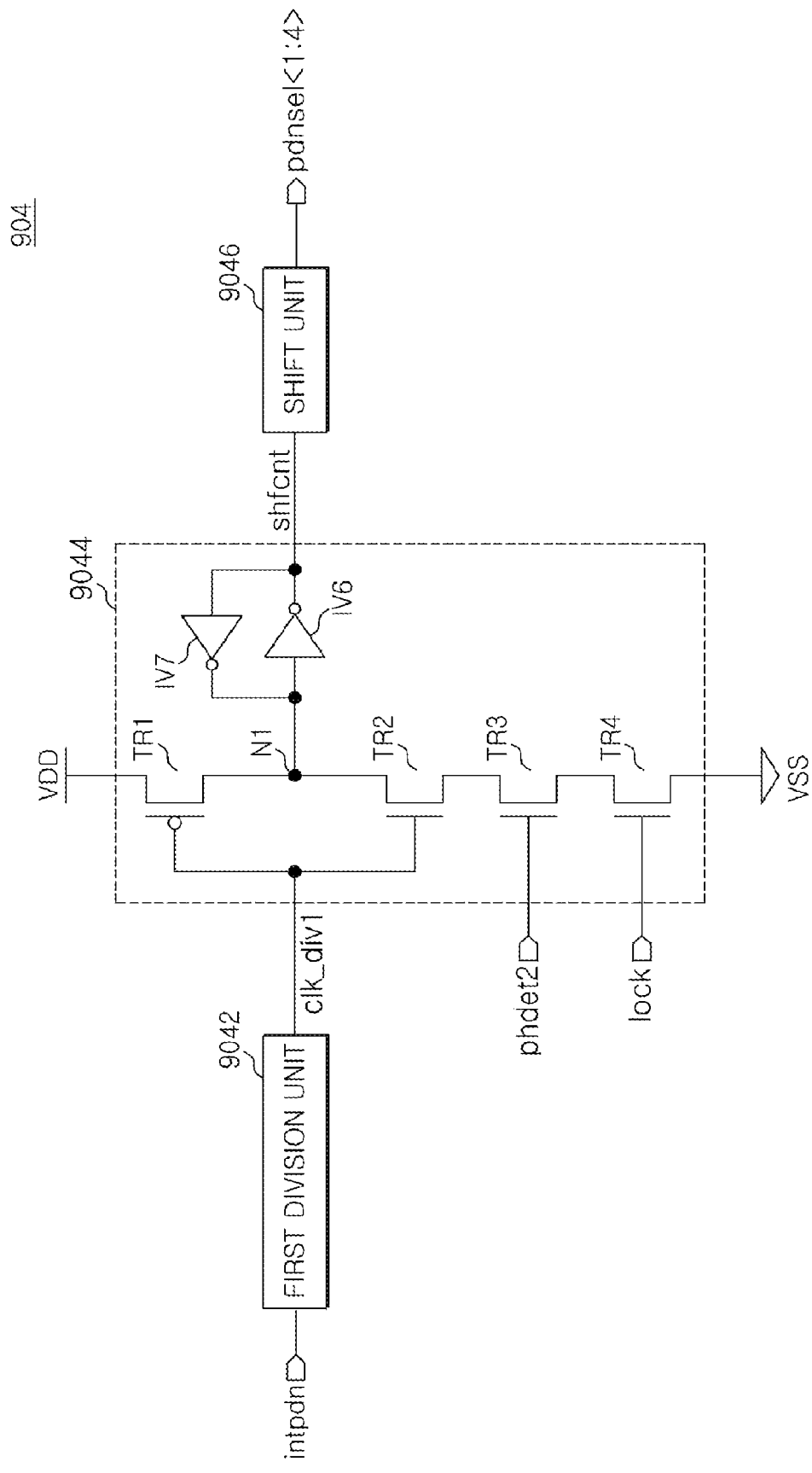
FIG. 5 is a diagram illustrating a detailed configuration of a noise check block that can be included in the circuit illustrated in FIG. 3.

FIG. 5 is a diagram illustrating a detailed configuration of a noise check block 904 that can be included in the circuit illustrated in FIG. 3. Referring to FIG. 5, the noise check block 904 can include a first division unit 9042, a shift control unit 9044, and a shift unit 9046. The first division unit 9042 can divide a frequency of the internal power-down signal "intpdn" by a predetermined division ratio to generate a first divided clock signal "clk_div1". The first division unit 9042 can be implemented with a conventional clock signal divider, and the division ratio can be adjusted with a change in design.

The shift control unit 9044 can drive the first divided clock signal "clk_div1" to generate a shift control signal "shfcnt" in response to the second phase detection signal "phdet2" and the locking completion signal "lock". The shift control unit 9044 can include a first transistor TR1, a second transistor TR2, a third transistor TR3, a fourth transistor TR4, a sixth inverter IV6, and a seventh inverter IV7.

The first transistor TR1 has a gate to which the first divided clock signal "clk_div1" is input, a source to which an external power supply voltage VDD is applied, and a drain coupled with a first node N1. The second transistor TR2 has a gate which can receive the first divided clock signal "_div1", and a drain coupled with the first node N1. The third transistor TR3 can have a gate to which the second phase detection signal "phdet2" can be input, and a drain coupled with a source of the second transistor TR2. The fourth transistor TR4 can have a gate to which the locking completion signal "lock" can be input, a drain coupled with a source of the third transistor TR3, and a source coupled with the ground. The sixth inverter IV6 can be supplied with a voltage, which can be applied to the first node N1, and can output the shift control signal "shfcnt". The seventh inverter IV7 can form a latch structure together with the sixth inverter IV6.

The shift unit 9046 can generate the first to fourth power-down selection signals "pdnsel1" to "pdnsel4" in response to the shift control signal "shfcnt". The shift unit 9046 may be implemented with a conventional 4-bit shift register.

The noise check block 904, having the above-described structure, can recognize the occurrence/non-occurrence of noise if the second phase detection signal "phdet2" is enabled after the locking completion signal "lock" is enabled. Subsequently, the noise check block 904 can drive the first divided clock signal "clk_div1" in a non-inverting manner and also can latch a driven signal to enable the shift control signal "shfcnt", thereby operating the shift unit 9046. The shift unit 9046 can sequentially shift the logical values of the second to fourth power-down selection signals "pdnsel2" to "pdnsel4" from "0" to "1" for each rising edge of the shift control signal "shfcnt". This operation can be continuously performed until the second phase detection signal "phdet2" is disabled, that is, until the occurrence amount of noise is less than the critical value. Thereafter, the logical values of the first to fourth power-down selection signals "pdnsel1" to "pdnsel4" can be fixed.

Figure 6:
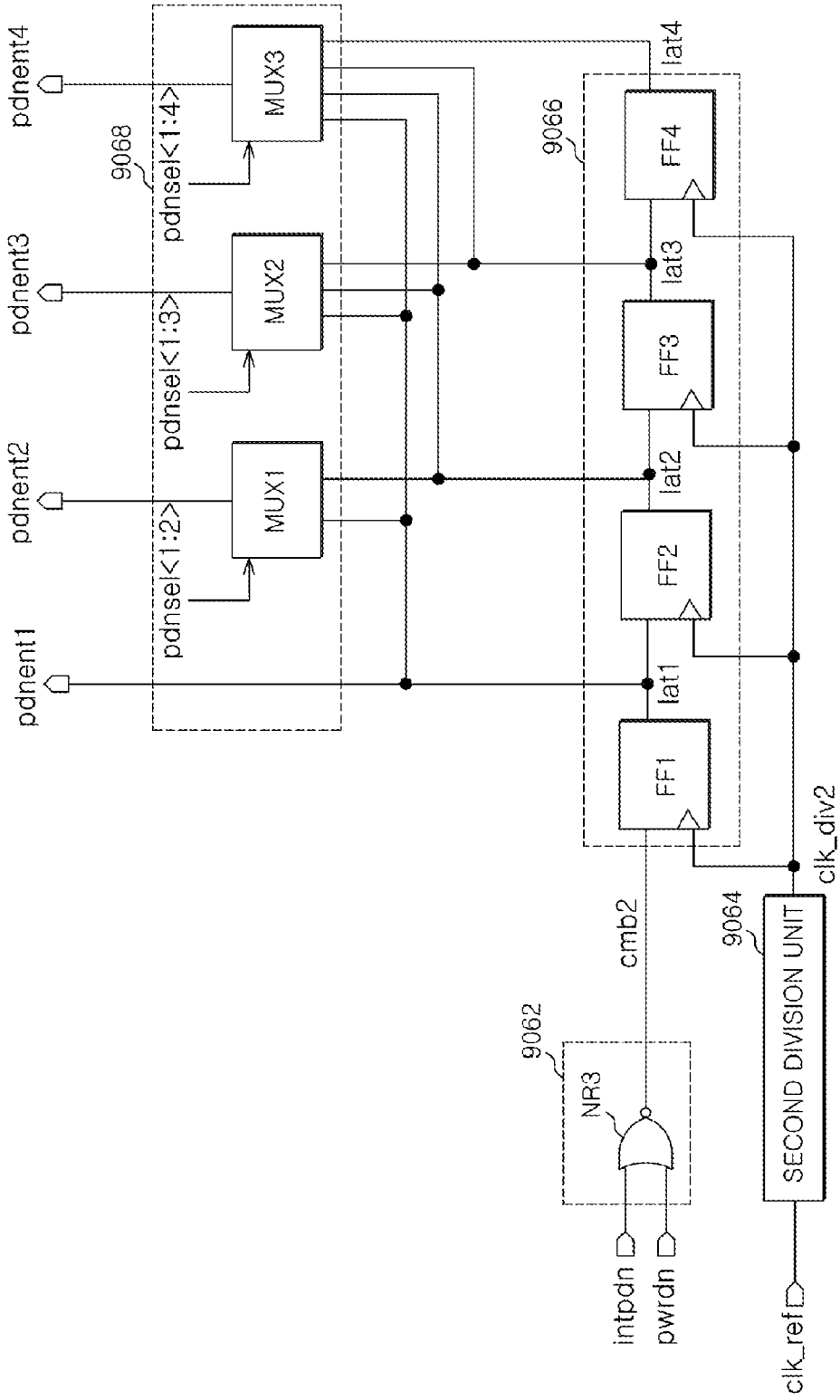
FIG. 6 is a diagram illustrating a detailed configuration of a power-down enter control block that can be included in the circuit illustrated in FIG. 3.

FIG. 6 is a diagram illustrating a detailed configuration of a power-down enter control block 906 that can be included in the circuit illustrated in FIG. 3. Referring to FIG. 6, the power-down enter control block 906 can include a second signal combination unit 9062, a second division unit 9064, a latch unit 9066, and a selection unit 9068.

The second signal combination unit 9062 can combine the internal power-down signal "intpdn" and the power-down mode signal "pwrdn" to generate a second combination signal "cmb2". The second signal combination unit 9062 includes a third NOR gate NR3 that can receive the internal power-down signal "intpdn" and the power-down mode signal "pwrdn", and output the second combination signal "cmb2".

The second division unit 9064 can divide a frequency of the reference clock signal "clk_ref" by a predetermined division ratio to generate a second divided clock signal "clk_div2". Similarly to the first division unit 9042, the second division unit 9064 may be implemented with a conventional clock signal divider, and the division ratio may be adjusted with a change in design.

The latch unit 9066 can sequentially latch the second combination signal "cmb2" in response to the second divided clock signal "clk_div2" and can output first to fourth latch signals "lat1" to "lat4". The latch unit 9066 can include a first flip-flop FF1, a second flip-flop FF2, a third flip-flop FF3, and a fourth flip-flop FF4.

The first flip-flop FF1 can latch the second combination signal "cmb2" in response to the second divided clock signal "clk_div2" and can output the first latch signal "lat1". The second flip-flop FF2 can latch the first latch signal "lat1" in response to the second divided clock signal "clk_div2" and can output the second latch signal "lat2". The third flip-flop FF3 can latch the second latch signal "lat2" in response to the second divided clock signal "clk_div2" and can output the third latch signal "lat3". The fourth flip-flop FF4 can latch the third latch signal "lat3" in response to the second divided clock signal "clk_div2" and can output the fourth latch signal "lat4".

The selection unit 9068 can selectively output the first to fourth latch signals "lat1" to "lat4" as the first to fourth power-down enter signals "pdnent1" to "pdnent4" in response to the first to fourth power-down selection signals "pdnsel1" to "pdnsel4". The selection unit 9068 cam include a first multiplexer MUX1, a second multiplexer MUX2, and a third multiplexer MUX3.

The first multiplexer MUX1 can output the second power-down enter signal "pdnent2" using the first latch signal "lat1" or the second latch signal "lat2" in response to the first and second power-down selection signals "pdnsel1" and "pdnsel2". The second multiplexer MUX2 can output the third power-down enter signal "pdnent3" using the first latch signal "lat1" or the second latch signal "lat2" or to the third latch signal "lat3" in response to the first to third power-down selection signals "pdnsel1" to "pdnsel3". The third multiplexer MUX3 can output the fourth power-down enter signal "pdnent4" using the first latch signal "lat1" or the second latch signal "lat2" or the third latch signal "lat3" or the fourth latch signal "lat4" in response to the first to fourth power-down selection signals "pdnsel1" to "pdnsel4".

In the power-down enter control block 906 having the above-described structure, when the power-down mode signal "pwrdn" is disabled, the second combination signal "cmb2" can be generated in a shape of an inverted signal of the internal power-down signal "intpdn". Meanwhile, if the power-down mode signal "pwrdn" is enabled, the second combination signal "cmb2" is at the low level.

The second combination signal "cmb2" can be sequentially input to the first to fourth flip-flops FF1 to FF4 of the latch unit 9066 for each rising edge of the second divided clock signal "clk_div2", and accordingly the first to fourth latch signals "lat1" to "lat4" can sequentially have predetermined values. The first latch signal "lat1" is always output as the first power-down enter signal "pdnent1".

If the logical values of the first to fourth power-down selection signals "pdnsel1" to "pdnsel4" are (1, 0, 0, 0), the first to fourth power-down enter signals "pdnent1" to "pdnent4" can all be generated by using the first latch signal "lat1". If the logical values of the first to fourth power-down selection signals "pdnsel1" to "pdnsel4" are (1, 1, 0, 0), the second to fourth power-down enter signals "pdnent2" to "pdnent4" can all be generated by using the second latch signal "lat2". If the logical values of the first to fourth power-down selection signals "pdnsel1" to "pdnsel4" are (1, 1, 1, 0), the second power-down enter signal "pdnent2" can be generated by using the second latch signal "lat2", and the third and fourth power-down enter signal "pdnent3" and "pdnent4" can be generated by using the third latch signal "lat3". If the logical values of the first to fourth power-down selection signals "pdnsel1" to "pdnsel4" are (1, 1, 1, 1), the second to fourth power-down enter signals "pdnent2" to "pdnent4" can be generated by using the second to fourth latch signals "lat2" to "lat4", respectively.

It should be noted that the first to fourth power-down enter signals "pdnent1" to "pdnent4" can be low enable signals.

When the internal power-down signal "intpdn" is at the high level, if the second divided clock signal "clk_div2" is changed to a high level, the first latch signal "lat1" can become a low level. Here, if the logical values of the first to fourth power-down selection signals "pdnsel1" to "pdnsel4" are (1, 0, 0, 0), the first latch signal "lat1" can be output as the first to fourth power-down enter signals "pdnent1" to "pdnent4", and the circuits, to which the first to fourth power-down can enter signals "pdnent1" to"pdnent4", can be stopped. Then, if the occurrence amount of noise exceeds a prescribed critical value, the noise check block 904 can change the logical values of the first to fourth power-down selection signals "pdnsel1" to "pdnsel4" to (1, 1, 0, 0). In this case, after the first power-down enter signal "pdnent1" is enabled or disabled, the second to fourth power-down enter signals "pdnent2" to "pdnent4" can be enabled or disabled.

Subsequently, the second combination signal "cmb2" which can be a phase opposite to that of the internal power-down signal "intpdn" can be latched in the first flip-flop FF1 for each rising edge of the second divided clock signal "clk_div2", and accordingly the first latch signal "lat1" can be generated. The second to fourth flip-flops FF2 to FF4 can sequentially receive the first latch signal "lat1" and can generate the second to fourth latch signals "lat2" to "lat4", respectively. Consequently, the first to fourth latch signals "lat1" to "lat4" can be generated at different timings according to the cycle of the second divided clock signal "clk_div2".

The noise check block 904 can continuously change the logical values of the first to fourth power-down selection signals "pdnsel1" to "pdnsel4" until the second phase detection signal "phdet2" is disabled, and if the second phase detection signal "phdet2" is disabled, the noise check block 904 can fix the logical values of the first to fourth power-down selection signals "pdnsel1" to "pdnsel4". At this time, even if the individual constituent elements of the DLL circuit 11 enter the power-down mode, the occurrence amount of noise does not exceed the critical value. Since the first to fourth latch signals "lat1" to "lat4" can be generated at different timings, the first to fourth power-down enter signals "pdnent1" to "pdnent4" can also be generated at different timings according to the combination of the first to fourth power-down selection signals "pdnsel1" to "pdnsel4". That is, the first to third multiplexers MUX1 to MUX3 can be controlled according to the first to fourth power-down selection signals "pdnsel1" to "pdnsel4". Therefore, the constituent elements to which the first to fourth power-down enter signals "pdnent1" to "pdnent4" can be supplied can enter the power-down mode simultaneously or sequentially.

With this operation, after the toggle period of the internal power-down signal intpdn ends and the power-down mode signal "pwrdn" is enabled, the first to fourth power-down enter signals "pdnent1" to "pdnent4" can be enabled simultaneously or sequentially according to the logical values of the first to fourth power-down selection signals "pdnsel1" to "pdnsel4". That is, the power-down mode can be internally tested before the power-down mode is activated, and thus the constituent elements can sequentially enter the power-down mode so as to minimize the occurrence amount of noise.

As described above, the power-down mode control apparatus can measure the occurrence amount of noise when the power-down mode is activated by toggling the internal power-down signal before the power-down mode is activated. Based on the measurement result, it is possible to determine whether or not to enable a plurality of power-down enter signals simultaneously or sequentially. Accordingly, it is possible to suppress occurrence of noise since the individual constituent elements of the DLL circuit simultaneously enter the power-down mode. Therefore, the DLL circuit having the power-down mode control apparatus can enable the individual constituent elements to enter the power-down mode simultaneously or sequentially, while suppressing occurrence of noise. As a result, noise can be minimized, and thus the operation stability can be markedly improved.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A DLL (Delay Locked Loop) circuit, comprising:
   a feedback loop configured to delay a reference clock signal to generate a delayed clock signal, a feedback clock signal, and a locking completion signal, and in response to first and second power-down enter signals, to determine entrance of individual constituent elements into a power-down mode;
   a first phase detection apparatus configured to determine whether or not a phase difference between the reference clock signal and the feedback clock signal exceeds a predetermined range, thereby generating a first phase detection signal; and
   a power-down mode control apparatus configured to determine whether or not to enable the first and/or second power-down enter signals in response to the reference clock signal, the first phase detection signal, the locking completion signal, and a power-down mode signal.

2. The DLL circuit of claim 1, wherein the feedback loop includes:
   a delay line configured to delay the reference clock signal in response to a delay control signal to generate the delayed clock signal;
   a delay compensation apparatus configured to, when the first power-down enter signal is disabled, delay the delayed clock signal for a prescribed time to generate the feedback clock signal;
   a second phase detection apparatus configured, when the second power-down enter signal is disabled, to compare the phase of the reference clock signal with the phase of the feedback clock signal, thereby generating a second phase detection signal;
   an operation mode setting apparatus configured to generate the locking completion signal in response to the second phase detection signal; and
   a delay control apparatus configured to generate the delay control signal in response to the second phase detection signal and the locking completion signal.

3. The DLL circuit of claim 1, wherein the first phase detection apparatus includes:
   a first detection block configured to detect whether or not the feedback clock signal has a more advanced phase than the phase of the reference clock signal for a first time, thereby generating a first detection signal;
   a second detection block configured to detect whether or not the reference clock signal has a more advanced phase than the phase of the feedback clock signal for a second time, thereby generating a second detection signal; and
   a signal combination block configured to combine the first detection signal and the second detection signal to generate the first phase detection signal.

4. The DLL circuit of claim 2, wherein, in a state where the locking completion signal is enabled and the power-down mode signal is disabled, the power-down mode control apparatus is configured to enable the first and second power-down enter signals to stop the delay compensation apparatus and the second phase detection apparatus, to check occurrence of noise, and to enable the first and second power-down enter signals simultaneously or sequentially.

5. The DLL circuit of claim 4, wherein the power-down mode control apparatus includes:
   an internal power-down control block configured to receive a locking completion signal and to generate an internal power-down signal, which is toggled for a predetermined time;
   a noise check block configured to check occurrence/non-occurrence of noise on the basis of the first phase detection signal, and to generate first and second power-down selection signals in response to the locking completion signal and the internal power-down signal; and
   a power-down enter control block configured to generate the first and second power-down enter signals in response to the reference clock signal, the first and second power-down selection signals, the power-down mode signal, and the internal power-down signal.

6. The DLL circuit of claim 5, wherein the noise check block is configured to change the logical values of the first and second power-down selection signals in response to the internal power-down signal when the locking completion signal and the first phase detection signal are enabled, and to fix the logical values of the first and second power-down selection signals when the first phase detection signal is disabled.

7. The DLL circuit of claim 5, wherein the power-down enter control block is configured to enable the first and second power-down enter signals simultaneously or sequentially in correspondence with the logical values of the first and second power-down selection signals under the control of the reference clock signal if the internal power-down signal or the power-down mode signal is enabled.

8. A DLL circuit, comprising:
   a feedback loop configured to delay a reference clock signal in response to a plurality of sample clock signals to generate a delayed clock signal, a feedback clock signal, and a locking completion signal;
   a first phase detection apparatus configured to determine whether or not a phase difference between the reference clock signal and the feedback clock signal exceeds a predetermined range, thereby generating a first phase detection signal;
   a power-down mode control apparatus configured to determine whether or not to enable first and/or second power-down enter signals in response to the reference clock signal, the first phase detection signal, the locking completion signal, and a power-down mode signal;
   a clock signal driver configured to drive the reference clock signal to generate a driving clock signal when the first power-down enter signal is disabled,; and
   a clock signal generator configured to generate the plurality of sample clock signals in response to the driving clock signal when the second power-down enter signal is disabled.

9. The DLL circuit of claim 8, wherein, in a state where the locking completion signal is enabled and the power-down mode signal is disabled, the power-down mode control apparatus is configured to enable the first and second power-down enter signals to stop the clock signal driver and the clock signal generator, to check occurrence of noise, and to enable the first and second power-down enter signals simultaneously or sequentially.

10. The DLL circuit of claim 9, wherein the power-down mode control apparatus includes:
    an internal power-down control block configured to receive a locking completion signal and to generate an internal power-down signal, which is toggled for a predetermined time;
    a noise check block configured to check occurrence/non-occurrence of noise on the basis of the first phase detection signal, and to generate first and second power-down selection signals in response to the locking completion signal and the internal power-down signal; and
    a power-down enter control block configured to generate the first and second power-down enter signals in response to the reference clock signal, the first and second power-down selection signals, the power-down mode signal, and the internal power-down signal.

11. The DLL circuit of claim 10, wherein the noise check block is configured to change the logical values of the first and second power-down selection signals in response to the internal power-down signal if the locking completion signal and the first phase detection signal are enabled, and to fix the logical values of the first and second power-down selection signals if the first phase detection signal is disabled.

12. The DLL circuit of claim 10, wherein the power-down enter control block is configured to enable the first and second power-down enter signal simultaneously or sequentially in correspondence with the logical values of the first and second power-down selection signals under the control of the reference clock signal if the internal power-down signal or the power-down mode signal is enabled.

\* \* \* \* \*